(12) United States Patent
Lee et al.

(10) Patent No.: US 8,466,470 B2
(45) Date of Patent: Jun. 18, 2013

(54) DISPLAY DEVICE

(75) Inventors: Jung-Min Lee, Yongin (KR); Choong-Ho Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 229 days.

(21) Appl. No.: 12/870,019

(22) Filed: Aug. 27, 2010

(65) Prior Publication Data

US 2011/0068346 A1    Mar. 24, 2011

(30) Foreign Application Priority Data

Sep. 2, 2009   (KR) .................. 10-2009-0082594

(51) Int. Cl.
*H01L 27/14*   (2006.01)

(52) U.S. Cl.
USPC ......... 257/72; 257/59; 257/258; 257/E33.053

(58) Field of Classification Search
USPC ............................ 257/59, 72, 258, E33.053
See application file for complete search history.

(56) References Cited

U.S. PATENT DOCUMENTS

| | | | |
|---|---|---|---|
| 7,002,809 B2 * | 2/2006 | Lee ............................. | 361/789 |
| 7,492,434 B2 | 2/2009 | Kudo et al. | |
| 2007/0030433 A1 | 2/2007 | Kudo et al. | |
| 2007/0076393 A1 | 4/2007 | Jeong et al. | |
| 2008/0099733 A1 | 5/2008 | Kim et al. | |
| 2008/0284000 A1 | 11/2008 | Fee et al. | |
| 2009/0001567 A1 * | 1/2009 | Shih et al. ................ | 257/737 |

FOREIGN PATENT DOCUMENTS

| | | |
|---|---|---|
| JP | 06-148663 A | 5/1994 |
| JP | 08-124613 A | 5/1996 |
| JP | 09-146110 A | 6/1997 |
| JP | 10-284817 A | 10/1998 |
| JP | 11-068278 A | 3/1999 |
| JP | 2003-151439 A | 5/2003 |
| JP | 2004-047446 A | 2/2004 |
| JP | 2008-300206 A | 12/2008 |
| JP | 2009-75232 A | 4/2009 |
| KR | 10-2005-0001917 | 1/2005 |
| KR | 10-2006-0005910 | 1/2006 |
| KR | 1020080048423 A | 6/2008 |
| KR | 1020090019797 A | 2/2009 |

* cited by examiner

*Primary Examiner* — Tan N Tran
(74) *Attorney, Agent, or Firm* — Robert E. Bushnell, Esq.

(57) ABSTRACT

A display device includes a wire substrate including a wire unit for driving the display device, an integrated circuit chip mounted at the wire substrate, and a pad unit extended from the wire unit to be disposed between the wire substrate and the integrated circuit chip. The pad unit is connected to the integrated circuit chip. The pad unit includes a first conductive layer extended from the wire unit, and a second conductive layer disposed on the first conductive layer. The hardness of the second conductive layer is less than the hardness of the first conductive layer.

14 Claims, 10 Drawing Sheets

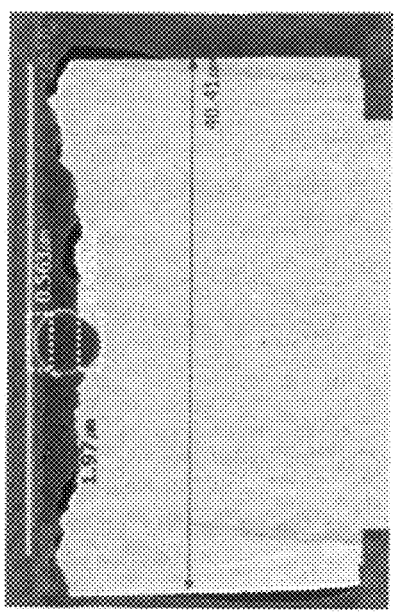
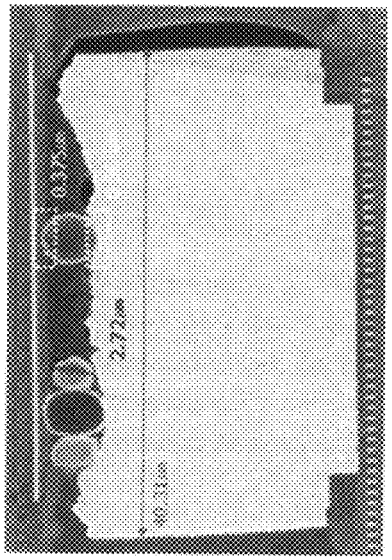
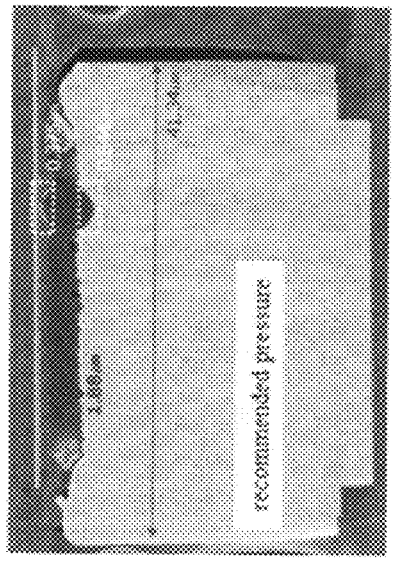
FIG. 9

FIG.11

Simulation

| Nominal P (MPa) | Real P (MPa) | δ (um) | bump (um) | pad (um) | Real P/Nominal P (%) |
|---|---|---|---|---|---|
| 65 | 19.5 | 2.4 | 0.56 | 0.29 | 30 |
| 70 | 21.7 | 2.1 | 0.71 | 0.34 | 31 |
| 75 | 24.0 | 2.0 | 0.83 | 0.38 | 32 |
| 80 | 26.8 | 1.8 | 0.90 | 0.45 | 33.5 |
| 85 | 30.0 | 1.6 | 0.96 | 0.53 | 35 |

Test

| | δ (nm) | bump (um) | pad (um) |
|---|---|---|---|
| 65 MPa | 2.7 | 0.56 | 0.30 |
| 75 MPa | 1.9 | 0.84 | 0.38 |
| 85 MPa | 2.0 | 0.94 | 0.56 |

DISPLAY DEVICE

CLAIM OF PRIORITY

This application makes reference to, incorporates the same herein, and claims all benefits accruing under 35 U.S.C §119 from an application earlier filed in the Korean Intellectual Property Office on 2 Sep. 2009 and there duly assigned Ser. No. 10-2009-0082594.

BACKGROUND OF THE INVENTION

1. Field of the Invention

The described technology relates generally to a display device. More particularly, the described technology relates generally to a display device mounted with an integrated circuit chip.

2. Description of the Related Art

As a display device for displaying images, an organic light emitting diode (OLED) display has recently been spotlighted.

The OLED display has self-luminance characteristics, and the thickness and weight thereof can be reduced since a separate light source is not required, unlike a liquid crystal display (LCD). In addition, the OLED display has high-quality characteristics such as low power consumption, high luminance, fast reaction time, and the like.

In a display device such as the organic light emitting diode (OLED) display, an element is formed on a substrate made of a material such as glass or plastic to manufacture the display device, and an integrated circuit chip for generating various signals to operate the display device may be mounted at a predetermined region of the substrate where the display device is formed. Here, the integrated circuit chip may be divided into a chip on glass (COG) or a chip on flexible printed circuit board (FPCB) (COF) according to the mounting position. Here, COG means a type in which the integrated circuit chip is mounted on the substrate, and COF means a type in which the integrated circuit chip is mounted on a film such as a polyimide film for the FPCB.

Among them, in the case of the COG in which the integrated circuit chip is mounted on the substrate, an anisotropic conductive film (ACF) is interposed between a pad formed in the substrate and the terminal of the integrated circuit chip, and the integrated circuit chip is mounted on the substrate. Here, a direct connection between the pad of the substrate and the terminal of the integrated circuit chip is realized by conductive balls included in the anisotropic conductive film, and adhesion between the substrate and the integrated circuit chip is realized by an adhesive layer enclosing the conductive balls included in the anisotropic conductive film. The conductive balls are compressed between the pad of the substrate and the terminal of the integrated circuit chip, and the conductive balls have excellent elastic restoring force such that the contact area between the pad and the terminal is increased by the pressure applied by the pad and the terminal, such that the contact resistance between the conductive balls and the pad, and the conductive balls and the terminal, is decreased according to an increase of the pressure applied to the conductive balls.

However, when pressure of more than a predetermined amount is applied to the conductive balls, the elastic restoring force of the compressed conductive balls exceeds the fixing capacity limit of the adhesive layer executing the adhesion between the substrate and the integrated circuit chip such that the adhesive layer does, not maintain the compressed shape of the conductive balls, and thereby the shape of the conductive balls is restored, and accordingly the contact resistance between the conductive balls and the pad, and the conductive balls and the terminal, is increased.

The above information disclosed in this Background section is only for enhancement of understanding of the background of the described technology and therefore it may contain information that does not form the prior art that is already known in this country to a person of ordinary skill in the art.

SUMMARY OF THE INVENTION

Embodiments of the present invention to solve the above-described problem prevent the increase of the contact resistance between the substrate and the integrated circuit chip by fixing the compressed shape of the conductive balls.

The inventors of the present invention have detected a problem that, when pressure of more than the predetermined pressure is applied to the conductive balls, the adhesive layer does not maintain the compressed shape of the conductive balls by the elastic restoring force of the conductive balls, and particularly detected the problem that disconnection between the wire substrate and the integrated circuit chip is often generated while the width of the wire substrate is changed from a micrometer scale to a nanometer scale according to the technique of developing microelectromechanical systems (MEMS). The inventors of the present invention have solved the above-described problem through in-depth research and experiments as follows.

A display device according to the present invention includes a wire substrate including a wire unit for driving the display device; an integrated circuit chip mounted on the wire substrate, and a pad unit disposed between the wire substrate and the integrated circuit chip. The pad unit is connected to the integrated circuit chip. The pad unit includes a first conductive layer coupled to the wire unit, and a second conductive layer disposed on the first conductive layer. Hardness of the second conductive layer is less than hardness of the first conductive layer.

The integrated circuit chip may include a circuit chip main body unit, and a connection terminal extended from the circuit chip main body unit and coupled to the pad unit.

The display device may further include an anisotropic conductive film disposed between the integrated circuit chip and the pad unit, mounting the integrated circuit chip to the wire substrate.

The anisotropic conductive film may include conductive balls directly connecting the connection terminal to the second conductive layer.

Each of conductive balls may include a central portion including a hyper-elastic material, and an outer portion enclosing the central portion. The outer portion may include gold (Au), silver (Ag), or copper (Cu).

The first conductive layer may include a plurality of sub-layers, and one of the sub-layers contacting the second conductive layer includes titanium (Ti).

The second conductive layer may have higher electrical conductivity than the first conductive layer.

The second conductive layer may include gold (Au), silver (Ag), or copper (Cu).

The conductive balls may be compressed between the second conductive layer and the connection terminal.

The second conductive layer and the connection terminal may be indented by the conductive balls, and the second conductive layer may be thicker than the indents formed by the conductive balls.

The second conductive layer may be formed only in a region corresponding to the conductive balls on the first conductive layer. The second conductive layer may be completely covered by the anisotropic conductive film The wire unit may include a thin film transistor including a source electrode and a drain electrode. The first conductive layer is made of the same material as the source electrode and the drain electrode of the thin film transistor.

The wire substrate may include a first electrode electrically connected to the drain electrode, an organic emission layer disposed on the first electrode, and a second electrode disposed on the organic emission layer.

The display device may further include an encapsulation substrate disposed on the wire substrate. An area of the encapsulation substrate may be smaller than an area of the wire substrate. The integrated circuit chip may be mounted on an edge region of the wire substrate which is not covered by the encapsulation substrate.

According to the present invention, the pad unit includes the second conductive layer having the lesser hardness than the first conductive layer such that contact resistance between the substrate and the integrated circuit chip may be minimized.

BRIEF DESCRIPTION OF THE DRAWINGS

A more complete appreciation of the invention, and many of the attendant advantage thereof, will be readily apparent as the same becomes better understood by reference to the following detailed description when considered in conjunction with the accompanying drawings in which like reference symbols indicate the same or similar components, wherein:

FIG. 9 to FIG. 11 are views explaining reasons to invent a display device according to an exemplary embodiment.

DETAILED DESCRIPTION OF THE INVENTION

Figure 1:
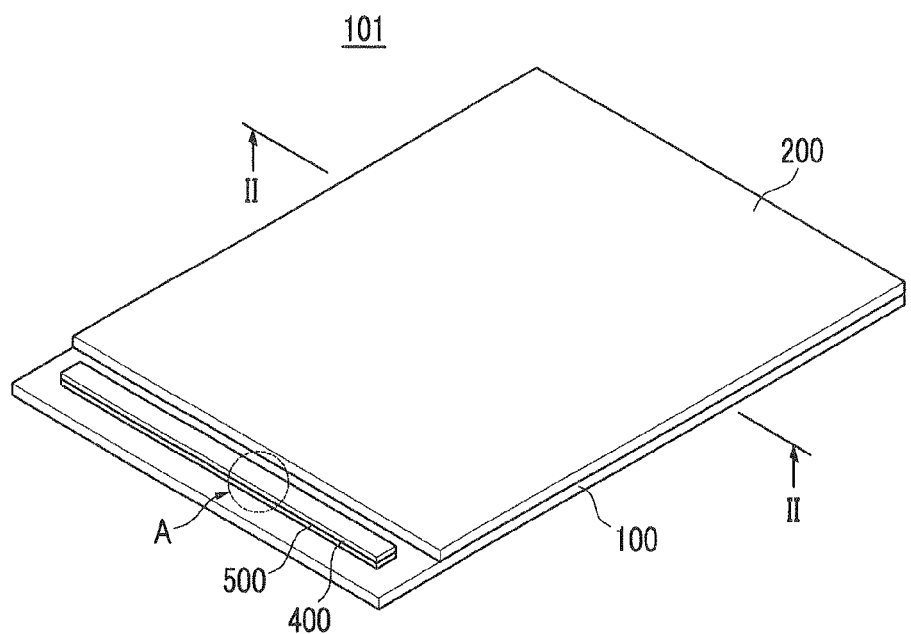
FIG. 1 is a perspective view showing a display device according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

In order to clarify layers and regions, thicknesses and sizes thereof are exemplarily illustrated and thus the present invention is not limited thereto.

In the drawings, the thickness of layers, films, panels, regions, etc., are exaggerated for clarity. In addition, in order to clarify some layers and some regions, thicknesses and sizes thereof are enlarged in the drawings. It will be understood that when an element such as a layer, film, region, or substrate is referred to as being "on" another element, it can be directly on the other element or intervening elements may also be present.

In addition, as the display device, an organic light emitting diode (OLED) display including an organic emission layer will be described as an exemplary embodiment, but it is not limited thereto, and the display device according to the present invention may be a liquid crystal display (LCD), a plasma display panel (PDP), or a field emission display.

Further, although an active matrix type of OLED display of two-transistors and one-capacitor (2Tr-1Cap) structure in which one pixel has two thin film transistors and one capacitor is illustrated in the accompanying drawings, the present invention is not limited thereto. Accordingly, the organic light emitting diode (OLED) display is not limited by the number of thin film transistors, capacitors, and wires. Here, the pixel is a minimum unit that can display an image, and the OLED display displays an image using a plurality of pixels.

Hereafter, a display device according to an exemplary embodiment will be described with reference to FIG. 1 to FIG. 8.

FIG. 1 is a perspective view showing a display device according to an exemplary embodiment.

As shown in FIG. 1, a display device according to an exemplary embodiment includes a wire substrate 100, an encapsulation substrate 200, a pad unit 300 (shown in FIG. 5), an integrated circuit chip 400, and anisotropic conductive film (ACF) 500.

The encapsulation substrate 200 has a smaller area than the wire substrate 100, and covers the wire substrate 100 except an edge region of the wire substrate 100. Herein, the area of the encapsulation substrate 200 means an area of a surface of the encapsulation substrate 200 that is arranged to face the wire substrate 100. The area of the wire substrate 100 is an area of a surface of the wire substrate 100 that is arranged to face the encapsulation substrate 200. The encapsulation substrate 200 is made of an insulating material such as glass, quartz, ceramic, and plastic. The encapsulation substrate 200 exposes an edge region of the wire substrate 100, and the integrated circuit chip 400 is mounted on the edge region of the wire substrate 100 close to the encapsulation substrate 200 through the anisotropic conductive film 500 in the exposed edge region of the wire substrate 100.

Figure 2:
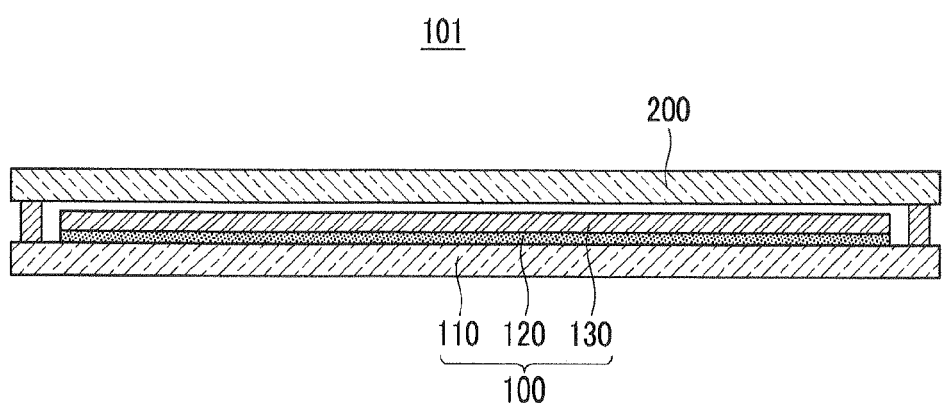
FIG. 2 is a cross-sectional view taken along the line II-II of FIG. 1.

FIG. 2 is a cross-sectional view taken along the line II-II of FIG. 1.

As shown in FIG. 2, the wire substrate 100 includes a substrate main body unit 110, a wire unit 120, and an organic light emitting element 130.

The substrate main body unit 110 is made of an insulting material such as glass, quartz, ceramic, and plastic. However, an exemplary embodiment is not limited thereto, and the substrate main body unit 110 may be made of a metal material such as stainless steel.

The wire unit 120 and the organic light emitting element 130 are disposed between the substrate main body unit 110 and the encapsulation substrate 200 disposed on the substrate main body unit 110.

The wire unit 120 includes first and second thin film transistors 10 and 20 (shown in FIG. 3) for driving the organic light emitting element 130. The organic light emitting element 130 emits light according to a driving signal applied from the wire unit 120.

Figure 3:
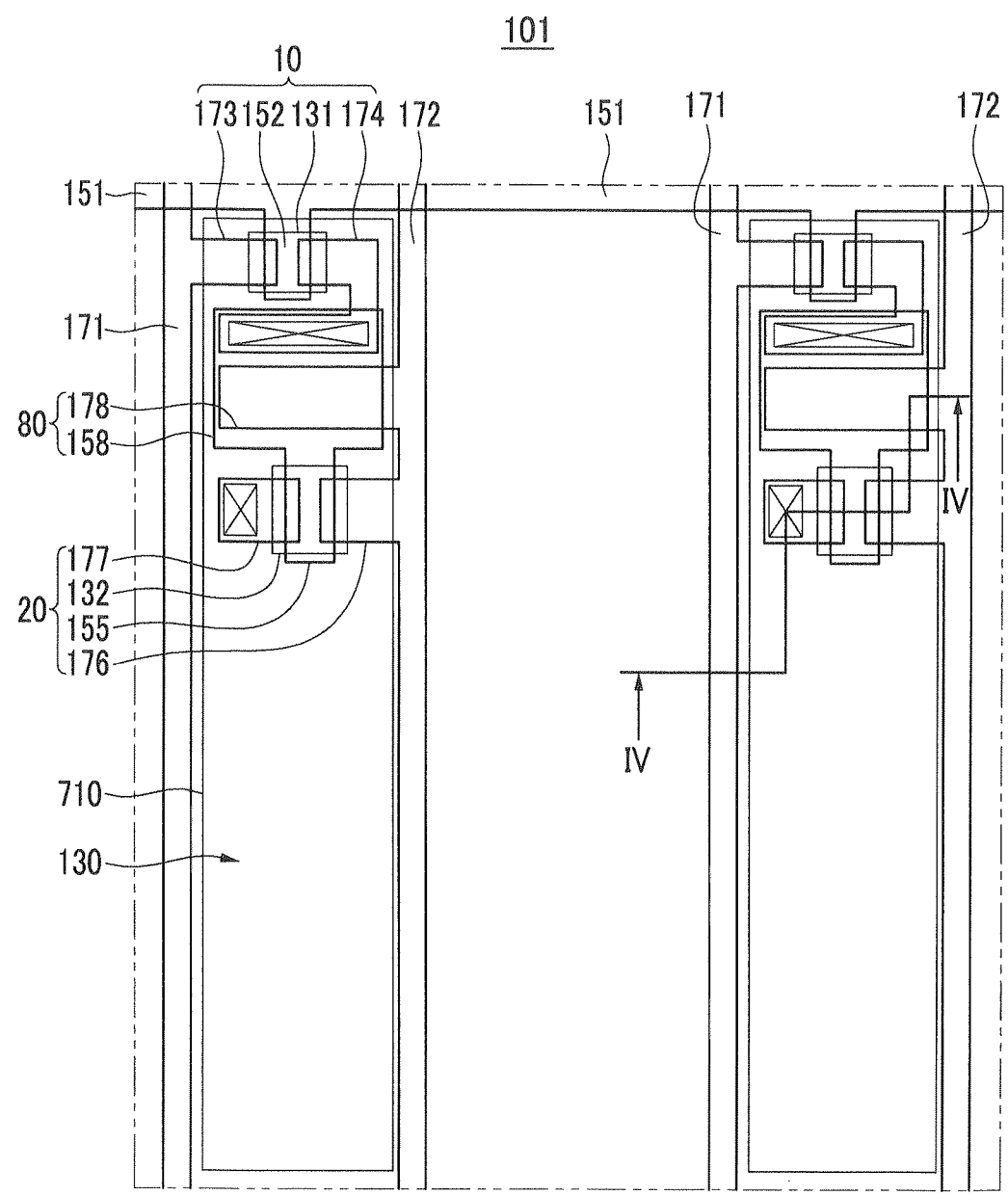
FIG. 3 is a layout view showing a pixel of a display device according to an exemplary embodiment.
Figure 4:
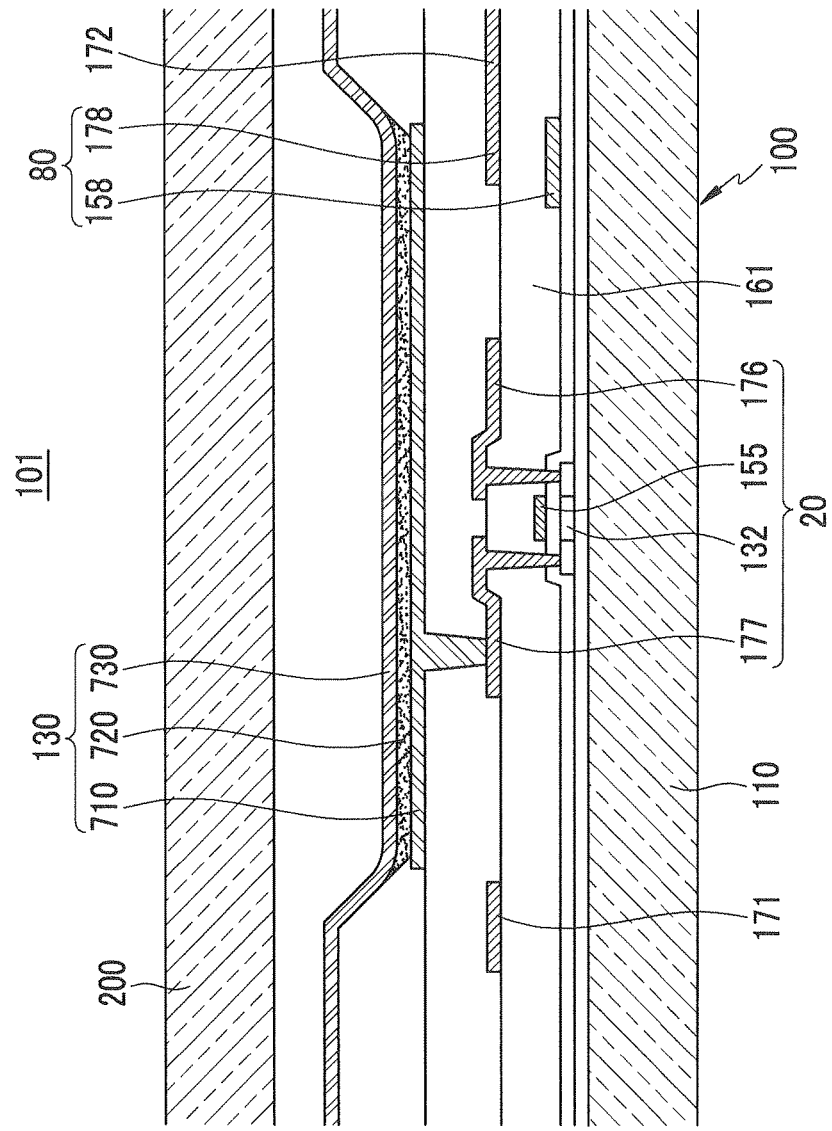
FIG. 4 is a cross-sectional view taken along the line IV-IV of FIG. 3.

The detailed structure of the organic light emitting element 130 and the wire unit 120 is shown in FIG. 3 and FIG. 4. However an exemplary embodiment is not limited by the structure shown in FIG. 3 and FIG. 4. The organic light emitting element 130 and the wire unit 120 may be variously modified within a range that can be easily realized by a person skilled in the art.

The inner structure of a display device 101 will be described with reference to FIG. 3 and FIG. 4.

FIG. 3 is a layout view showing of a pixel in a display device according to an exemplary embodiment. FIG. 4 is a cross-sectional view taken along the line IV-IV of FIG. 3.

As shown in FIG. 3 and FIG. 4, the display substrate 101 includes a switching thin film transistor 10, a driving thin film transistor 20, a capacitor 80, and an organic light emitting element 130 in each pixel. Here, the configuration including the switching thin film transistor 10, the driving thin film transistor 20, and the capacitor 80 is referred to as a wire unit 120. In addition, the wire unit 120 further includes a gate line 151 disposed along one direction of the substrate main body unit 110, a data line 171 intersecting the gate line 151, and a common power line 172. Here, one pixel may be defined by the gate line 151, the data line 171, and the common power line 172, but it is not necessarily limited thereto.

The organic light emitting element 130 includes a first electrode 710, an organic emission layer 720 formed on the first electrode 710, and a second electrode 730 formed on the organic emission layer 720. Here, the first electrode 710 is a positive electrode (+) as a hole injection electrode, and the second electrode 730 is a negative electrode (−) as an electron injection electrode. However, the exemplary embodiment is not limited thereto, and the first electrode 710 may be a cathode and the second electrode 730 may be an anode according to the driving method of the display device 101. Holes and electrons from the first electrode 710 and the second electrode 730 are respectively injected inside the organic emission layer 720, and when excitons being combinations of the injected holes and electrons shift from an excited state to a ground state, light is emitted from the organic emission layer 720.

Also, in the display device 101 according to an exemplary embodiment, the organic light emitting element 130 emits light in the direction of the encapsulation substrate 200. That is, the organic light emitting diode display 100 is a front emission type. Here, for the organic light emitting element 70 to emit the light in the direction of the encapsulation substrate 210, the pixel electrode (first electrode) 710 is made of a reflective conducting material, and the common electrode (second electrode) 730 is made of a transparent conducting material.

The capacitor 80 includes a pair of capacitor electrode plates 158 and 178, and an interlayer insulating layer 161 interposed between the two capacitor electrode plates 158 and 178. The interlayer insulating layer 161 functions as a dielectric, and the capacitance is determined depending upon electrical charges charged at the capacitor 80 and the voltages applied to the two capacitor electrode plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 is used as a switch for selecting pixels to emit light. The switching gate electrode 152 is connected to the gate line 151. The switching source electrode 173 is connected to the data line 171. The switching drain electrode 174 is separated from the switching source electrode 173, and is connected to the capacitor electrode plate 158.

The driving thin film transistor 20 applies a driving voltage to the pixel electrode 710 to excite the organic emissive layer 720 of the first organic light emitting diode 130 in the selected pixel. The driving gate electrode 155 is connected to the capacitor electrode plate 158 that is connected to the switching drain electrode 174. The driving source electrode 176 and the other capacitor electrode plate 178 are each connected to the common power line 172. The driving drain electrode 177 is connected to the first electrode 710 of the organic light emitting diode 70 through a contact hole.

The switching source electrode 173, the switching drain electrode 174, the driving source electrode 176, and the driving drain electrode 177 are formed with the same layer, and are made of the same material as the first conductive layer 310 of a pad unit 300 that will be described later. That is, the switching source electrode 173, the switching drain electrode 174, the driving source electrode 176, and the driving drain electrode 177 are formed with the same process as the first conductive layer 310 of the pad unit 300, thereby being connected to each other.

With the above structure, the switching thin film transistor 10 is operated by the gate voltage applied to the gate line 151, and transmits a data voltage applied to the data line 171 to the driving thin film transistor 20. A voltage corresponding to a difference between the common voltage applied to the driving thin film transistor 20 from the common power line 172 and the data voltage transmitted from the switching thin film transistor 10 is stored at the capacitor 80, and a current corresponding to the voltage stored at the capacitor 80 flows to the organic light emitting element 130 through the driving thin film transistor 20 to thereby excite the organic light emitting element 130.

Figure 5:
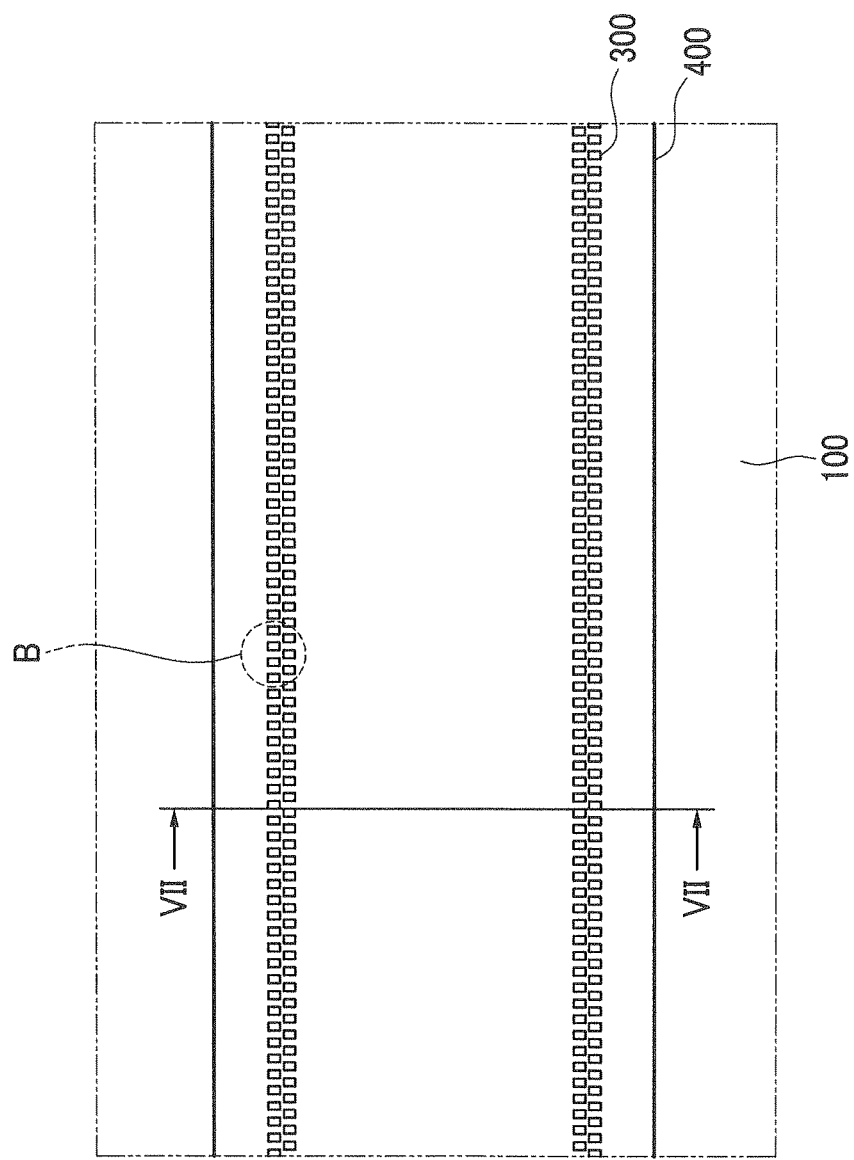
FIG. 5 is a top plan view enlarging a portion A of FIG. 1.
Figure 6:
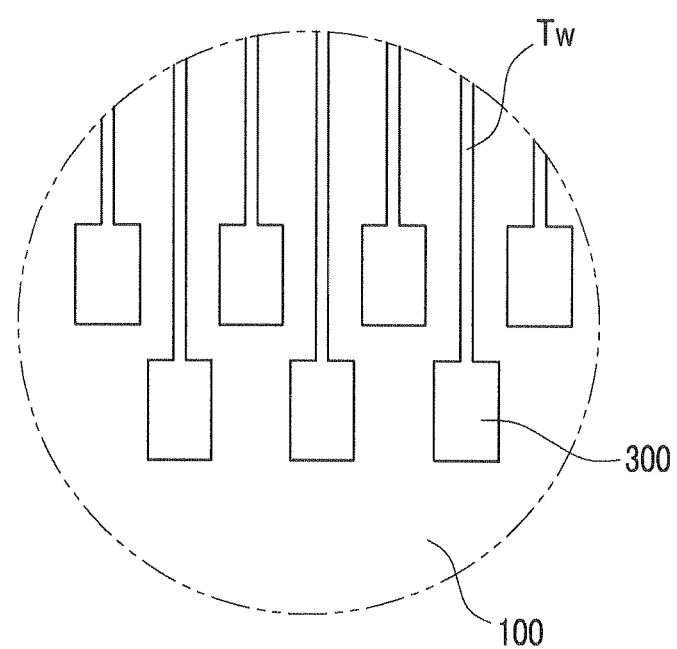
FIG. 6 is a top plan view enlarging a portion B of FIG. 5.

FIG. 5 is a top plan view enlarging a portion A of FIG. 1. FIG. 6 is a top plan view enlarging a portion B of FIG. 5.

As shown in FIG. 5 and FIG. 6, the pad unit 300 is connected to the thin film wire Tw extended from the wire unit 120. In detail, the thin film wire Tw connects the switching source electrode 173, the switching drain electrode 174, the driving source electrode 176 and the driving drain electrode 177 to the first conductive layer 310 (shown in FIG. 7) of the pad unit 300. The pad unit 300 is disposed in a location corresponding to the integrated circuit chip 400, and is connected to the integrated circuit chip 400 by an anisotropic conductive film 500, which will be described later.

Figure 7:
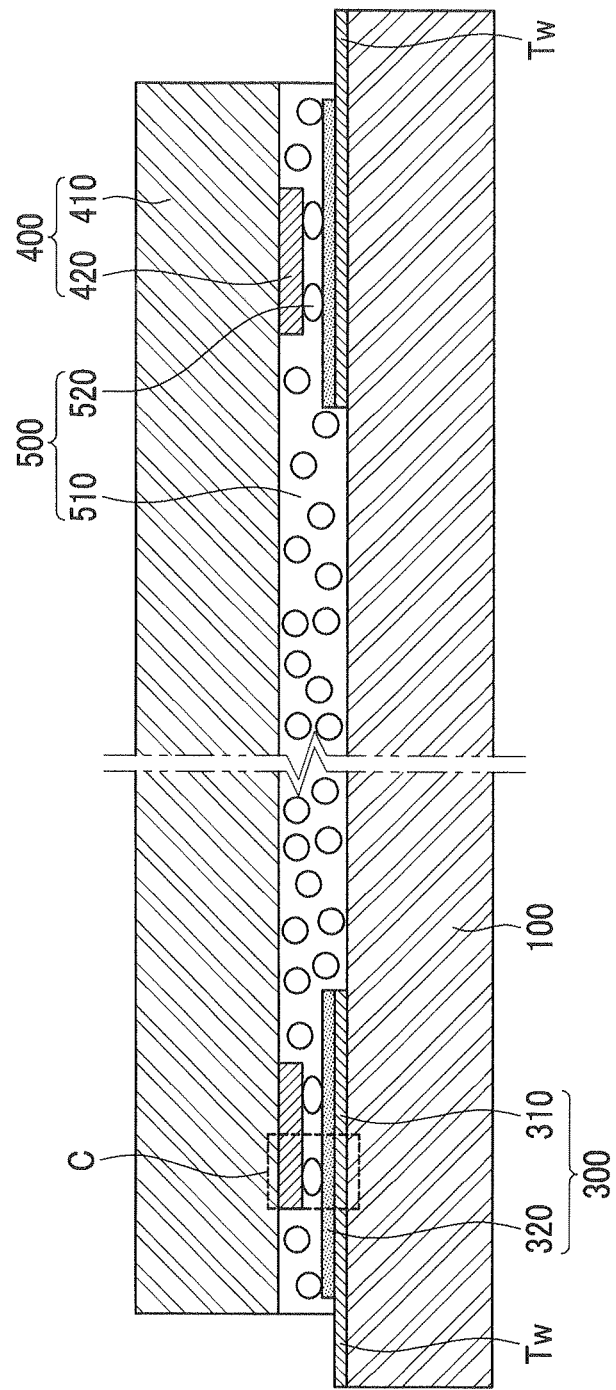
FIG. 7 is a cross-sectional view taken along the line VII-VII of FIG. 5.
Figure 8:
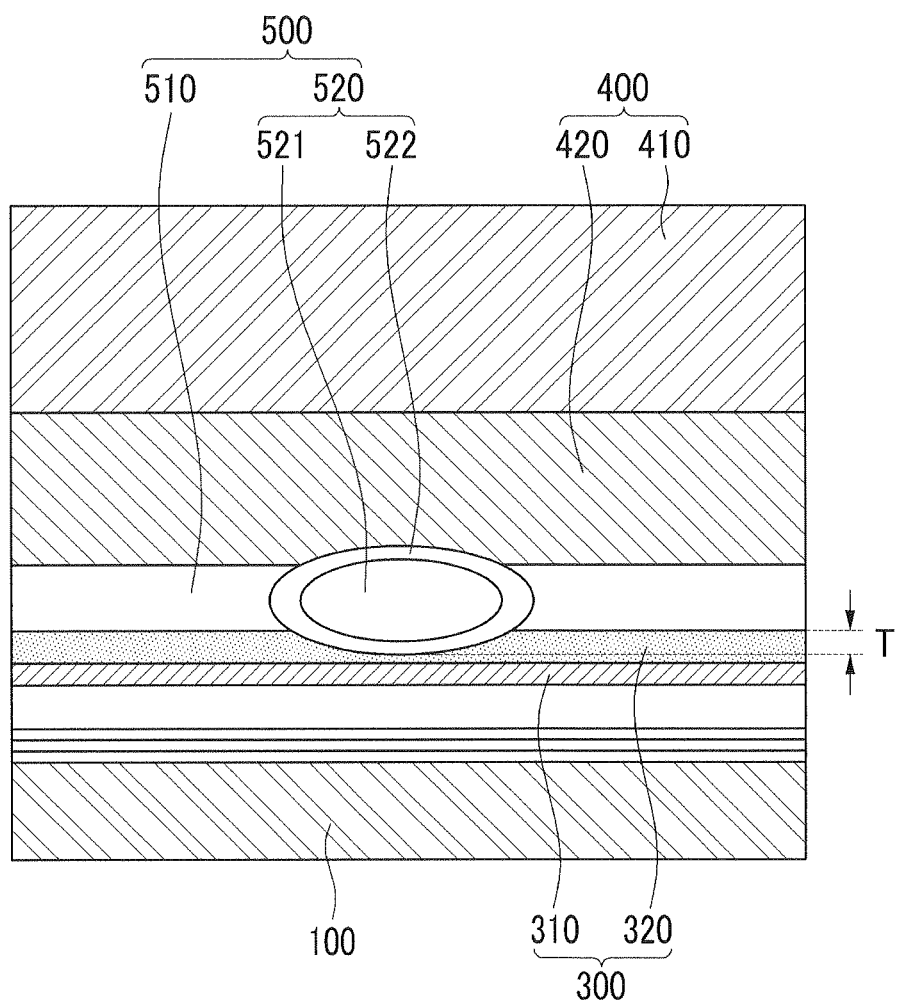
FIG. 8 is a cross-sectional view enlarging a portion C of FIG. 7.

FIG. 7 is a cross-sectional view taken along the line VII-VII of FIG. 5. FIG. 8 is a cross-sectional view enlarging a portion C of FIG. 7.

As shown in FIG. 7 and FIG. 8, the pad unit 300 includes a first conductive layer 310 and a second conductive layer 320.

The first conductive layer 310 is extended from the wire unit 120 by the thin film wire Tw. In an exemplary embodiment, the first conductive layer 310 is made of the same material as the switching source electrode 173, the switching drain electrode 174, the driving source electrode 176, and the driving drain electrode 177 of the wire unit 120. In another exemplary embodiment, the first conductive layer 310 includes a first sub-layer, a second sub-layer, and a third sub-layer that are sequentially deposited from the second conductive layer 320. The first sub-layer is made of titanium (Ti), the second sub-layer is made of aluminum (Al), and the third sub-layer is made of titanium (Ti). That is, the first conductive layer 310 includes a plurality of layers, and the first sub-layer neighboring the second conductive layer 320 among the plurality of layers is made of titanium.

In still another exemplary embodiment, the material of the first conductive layer 310 is not limited thereto, and is the same material as that of the source electrode and the drain electrode of the thin film transistor.

The second conductive layer 320 is made of a material, which has higher electrical conductivity and is softer than the material of the first conductive layer 310. In other words, the hardness of the second conductive layer 320 is less than the hardness of the first conductive layer 310. As the conductive balls 520 are pressed by the second conductive layer 320, the second conductive layer 320 is also pressed by the conductive balls 520. As a result, as shown in FIG. 8, the surface of the second conductive layer 320 is recessed inwards, forming an indent, by the pressure applied from the conductive balls 520. The second conductive layer 320 is indented by a conductive ball 520 of the anisotropic conductive film 500, and the thickness of the second conductive layer 320 is sufficiently larger than the size (or thickness) T of the indent formed by the conductive ball 520 such that the conductive ball 520 is indented into the second conductive layer 320. The second conductive layer 320 includes at least one of Au, Ag, and Cu, and is only formed in the region corresponding to the conductive ball 520 on the first conductive layer 310. In other words, the second conductive layer 320 is completely covered by the anisotropic conductive film 500 including the conductive balls 520. The present invention including the technical characteristics of the second conductive layer 320 is realized to ameliorate the problems of the prior art to be explicated later, but the explanation will be firstly given.

The integrated circuit chip 400 includes a connection terminal 420 extended from a circuit chip main body unit 410 and the circuit chip main body unit 410, and is connected to the pad unit 300. The integrated circuit chip 400 is connected to the pad unit 300, thereby controlling the light emitting of the organic light emitting element 130. In detail, the integrated circuit chip 400 is connected to the pad unit 300 through the anisotropic conductive film 500 to transmit a signal to the switching source electrode 173 and the driving source electrode 176, thereby operating the organic emission layer 720. The connection terminal 420 of the integrated circuit chip 400 is connected to the pad unit 300 through the conductive ball 520 of the anisotropic conductive film 500.

The anisotropic conductive film 500 connects the integrated circuit chip 400 to the pad unit 300, thereby having a function of mounting the integrated circuit chip 400 at the wire substrate 100. The anisotropic conductive film 500 includes an adhesive layer 510 and the conductive ball 520.

The adhesive layer 510 is disposed between the integrated circuit chip 400 and the wire substrate 100, and has a function of adhering between the integrated circuit chip 400 and the wire substrate 100. A plurality of conductive balls 520 are positioned in the adhesive layer 510, and the adhesive layer 510 prevents a short circuit between the neighboring conductive balls 520.

The conductive balls 520 are dispersed in the adhesive layer 510, and conductive balls 520, which are disposed between the connection terminal 420 of the integrated circuit chip 400 and the second conductive layer 320 of the pad unit 300 among the plurality of conductive balls 520, connect the connection terminal 420 and the second conductive layer 320 to each other. Each conductive ball 520 includes a central portion 521 made of a hyper-elastic material having excellent elastic restoring force, and an outer portion 522 enclosing the central portion 521 and including at least one of Ag, Au, and Cu having excellent electrical conductivity. The conductive balls 520 positioned between the connection terminal 420 of the integrated circuit chip 400 and the second conductive layer 320 of the pad unit 300 are compressed by the pressure of the connection terminal 420 and the second conductive layer 320, and apply the contact pressure in the direction of the connection terminal 420 and the second conductive layer 320 direction by the elastic restoring force. The outer portion 522 of the conductive ball 520 that contacts the connection terminal 420 and the second conductive layer 320 is indented into the connection terminal 420 and the second conductive layer 320, thereby respective indents in the connection terminal 420 and the second conductive layer 320 form the surface contact with the connection terminal 420 and the second conductive layer 320.

As described above, in the display device 101 according to an exemplary embodiment, the conductive ball 520 respectively forms the surface contact along with the connection terminal 420 and the second conductive layer 320, and applies the contact pressure in the direction of the connection terminal 420 and the second conductive layer 320 such that the contact resistance between the connection terminal 420 and the conductive ball 520, and between the second conductive layer 320 and the conductive ball 520, is minimized. That is, the contact resistance is minimized between the integrated circuit chip 400 and the pad unit 300 such that the mobility of the electrons is increased between the integrated circuit chip 400 and the pad unit 300.

The reason for inventing the display device 101 according to an exemplary embodiment will be described with reference to FIG. 9 to FIG. 11.

Figure 10:
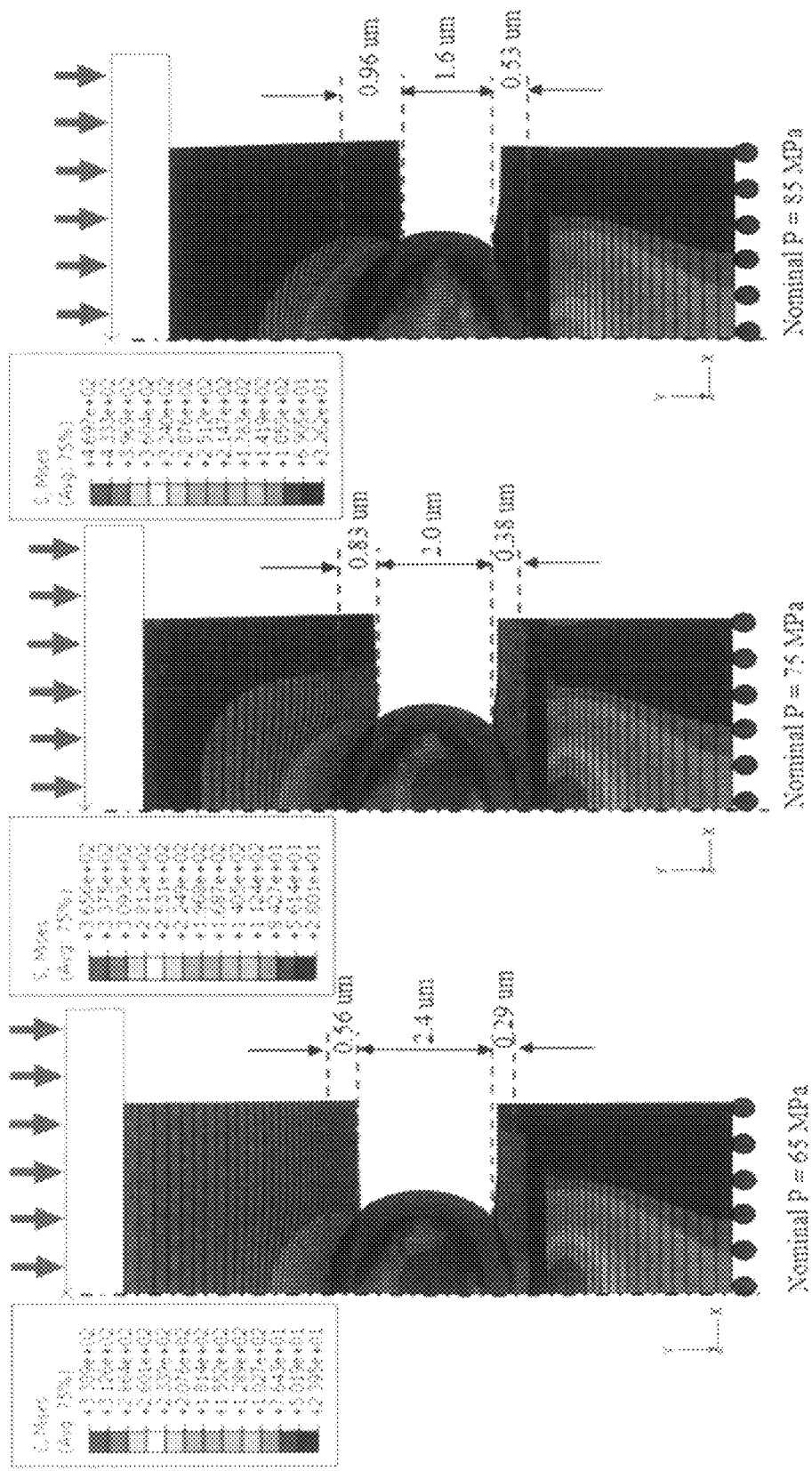

FIG. 9 to FIG. 11 are views explaining reasons for inventing a display device according to an exemplary embodiment.

FIG. 9 shows experimental data of measuring deformation of a conductive ball 520, a pad unit 300, and a connection terminal 420 when an integrated circuit chip 400 adheres to a wire substrate 100 by using an anisotropic conductive film 500 while changing adhering pressure under an environment of 210° C. in the case in which a pad unit 300 includes only the first conductive layer 310.

As shown in FIG. 9, when the adhering pressures are 65 MPa, 75 MPa, and 85 Mpa, the deformation amount of the conductive ball 520, the pad unit 300, and the connection terminal 420 is measured according to the adhering pressure, and the results thereof are represented as a table of FIG. 9. In the table, 'δ' is a distance between the pad unit 300 and the connection terminal 420, "bump" is the thickness of the indent formed in the connection terminal 420 by the conductive ball 520, and "pad" is the thickness of the indent formed in the pad unit 300 by the conductive ball 520.

As shown in FIG. 9, the elastic restoring force of the conductive ball 520 exceeds the fixing capacity limit of the adhesive layer 510 at the adhering pressure between 75 MPa to 85 MPa such that the adhesive layer 510 does not maintain the compression of the conductive ball 520, and thereby it is confirmed that the distance δ between the pad unit 300 and the connection terminal 420, which must be decreased according to the increasing of the pressure, is preferably increased at 85 MPa.

When the adhering pressure is 85 MPa, it is confirmed that the conductive ball 520 is further compressed through the thicknesses of bump and pad of the indent that is formed in the connection terminal 420 and the pad unit 300 by the conductive ball 520. As shown in the table, when the adhering pressure is 85 MPa, the thickness of the indent that is formed in the connection terminal 420 and the pad unit 300 by the conductive ball 520 is larger compared with the adhering pressure of 75 MPa.

FIG. 10 shows a simulation of the above-described phenomenon by using ABAQUS as a structure/electricity/thermal tool marketed by SIMULIA of Dassault Systemes S.A.

FIG. 10 shows the deformation of the connection terminal 420, the conductive ball 520, and the pad unit 300 under the adhering pressure of 65 to 85 MPa. As shown in FIG. 10, in the case of the simulation using the ABAQUS tool, the ABAQUS tool does not set the fact that the adhesive layer 510 does not fix the compressed state of the conductive ball 520 over the predetermined pressure such that the compression of the conductive ball 520 is generated under the adhering pressure of 85 MPa, therefore it may be confirmed that the distance between the connection terminal 420 and the pad unit 300 is reduced.

FIG. 11 shows test results obtained in a simulation and an experiment in a simulation using the ABAQUS tool. Here, 'δ' is a distance between the pad unit 300 and the connection terminal 420, "bump" is a thickness of an indent formed by the conductive ball 520 in the connection terminal 420, and "pad" is a thickness of an indent formed by the conductive ball 520 in the pad unit 300.

As shown in FIG. 11, when the adhering pressure is 85 MPa, the thickness δ of the experimental is about 2.0 μm, however the thickness δ of the simulation is about 1.6 μm. Compared with these, it may be confirmed that the conductive ball 520 is restored to an original state by about 0.4 μm at 75 Mpa to 85 MPa. The contact pressure between the conductive ball 520 and the pad unit 300 is increased as the adhering pressure is increased, as shown in the result of the simulation and the experimental results, and it may be confirmed that the fixing capacity of the adhesive layer 510 suppressing the restoring of the conductive ball 520 by the elastic restoring force is a threshold value when the adhering pressure is 85 MPa.

That is, the contact pressure between the conductive ball 520 and the pad unit 300 is increased as the adhering pressure is increased such that the conductive ball 520 is further compressed. The contact pressure of the interface between Au and Ti between the conductive ball 520 and the pad unit 300 is increased as the conductive ball 520 is compressed, and the contact resistance between the conductive ball 520 and the pad unit 300 is decreased. However, the stress of the central portion 521 of the conductive ball 520 is increased according to the increase of the pressure applied to the conductive ball 520, and thereby the elastic restoring force of the conductive ball 520 is increased. As described above, when the elastic restoring force of the conductive ball 520 generates the problem, if the contact pressure is sufficiently large and the stress of the central portion 521 is small, the elastic restoring force of the conductive ball 520 may non-linearly correspond to the pressure applied to the conductive ball 520.

Accordingly, the pad unit 300 of the display device 101 according to the present invention includes the first conductive layer 310 and the second conductive layer 320 made of a softer material than the first conductive layer 310 in order to make the conductive ball 520 indent the second conductive layer 320 by the adhering pressure while being compressed.

For example, for the present invention to explain the above-described causes, the pad unit 300 does not simply include the plurality of layers, but the pad unit 300 includes the plurality of layers considering the relationship between the conductive ball 520 and the pad unit 300 through the experiments and the simulation as the explanation process.

As described above, in the display device 101 according to an exemplary embodiment, the second conductive layer 320 is made of the material having the higher electrical conductivity and the lesser hardness than those of the first conductive layer 310, and the second conductive layer 320 is thicker than the indent formed by the conductive ball 520, so the conductive ball 520 may easily indent the second conductive layer 320 of the pad unit 300 while being compressed by the adhering pressure. As described above, the conductive ball 520 easily indents the second conductive layer 320 of the pad unit 300 while being compressed by the adhering pressure such that the contact pressure and the contact area between the conductive ball 520 and the pad unit 300 are increased, and simultaneously the elastic restoring force of the conductive ball 520 is non-linear with respect to the increase of the adhering pressure, thereby the contact resistance between the conductive ball 520 and the pad unit 300, and between the conductive ball 520 and the connection terminal 420, is minimized. That is, the mobility of the electrons is increased between the integrated circuit chip 400 and the pad unit 300, and simultaneously, disconnection between the integrated circuit chip 400 and the pad unit 300 is prevented.

Also, the second conductive layer 320 is only formed in the region corresponding to the conductive ball 520 on the first conductive layer 310, and the second conductive layer 320 may be formed by using a simple plating process on the first conductive layer 310 extended from the source electrode and the drain electrode such that the present invention may be realized with a low cost. As described above, the present invention may be applied to all pad units that are formed with the same material as a source electrode and a drain electrode forming a thin film transistor such that contact resistance is minimized between an integrated circuit chip 400 and a wire substrate 100 by applying the present invention to a pad unit of various display device irrespective of the kind of material forming the source electrode and the drain electrode of the display device, and thereby disconnection between the integrated circuit chip 400 and the wire substrate 100 may be prevented. That is, the present invention may be commonly applied to any display device generating the problems described above, and is simultaneously the basis invention to solve the above described problems.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
    a wire substrate including a wire unit for driving the display device, the wire unit including a thin film transistor including a source electrode and a drain electrode;
    an integrated circuit chip mounted on the wire substrate, the integrated circuit chip transmitting a signal to the wire unit to operate the display device; and
    a pad unit disposed between the wire substrate and the integrated circuit chip, the pad unit connected to the integrated circuit chip, the pad unit including:
        a first conductive layer coupled to the wire unit, the first conductive layer being made of the same material as the source electrode and the drain electrode of the thin film transistor, and
        a second conductive layer disposed on the first conductive layer, hardness of the second conductive layer being less than hardness of the first conductive layer.

2. The display device of claim 1, wherein the integrated circuit chip comprises:
    a circuit chip main body unit, and
    a connection terminal extended from the circuit chip main body unit and coupled to the pad unit.

3. The display device of claim 2, further comprising an anisotropic conductive film disposed between the integrated circuit chip and the pad unit, the anisotropic conductive film mounting the integrated circuit chip to the wire substrate.

4. The display device of claim 3, wherein the anisotropic conductive film includes conductive balls directly connecting the connection terminal to the second conductive layer.

5. The display device of claim 4, wherein each of the conductive balls comprises:
   a central portion including a hyper-elastic material, and
   an outer portion enclosing the central portion, the outer portion including gold (Au), silver (Ag), or copper (Cu).

6. The display device of claim 4, wherein at least one of the conductive balls is compressed between the second conductive layer and the connection terminal.

7. The display device of claim 4, wherein the second conductive layer and the connection terminal are indented by the conductive balls, and the second conductive layer is thicker than the indents formed by the conductive balls.

8. The display device of claim 4, wherein the second conductive layer is formed only in a region corresponding to the conductive balls on the first conductive layer.

9. The display device of claim 4, wherein the second conductive layer is completely covered by the anisotropic conductive film.

10. The display device of claim 1, wherein the first conductive layer includes a plurality of sub-layers, and one of the sub-layers contacting the second conductive layer including titanium (Ti).

11. The display device of claim 1, wherein the second conductive layer has higher electrical conductivity than the first conductive layer.

12. The display device of claim 1, wherein the second conductive layer includes gold (Au), silver (Ag), or copper (Cu).

13. The display device of claim 1, wherein the wire substrate comprises;
   a first electrode electrically connected to the drain electrode;
   an organic emission layer disposed on the first electrode; and
   a second electrode disposed on the organic emission layer.

14. The display device of claim 1, further comprising an encapsulation substrate disposed on the wire substrate, an area of the encapsulation substrate being smaller than an area of the wire substrate, the integrated circuit chip being mounted on an edge region of the wire substrate which is not covered by the encapsulation substrate.

* * * * *